(12) United States Patent
Durand et al.

(10) Patent No.: US 12,503,766 B2
(45) Date of Patent: Dec. 23, 2025

(54) VAPOR CONCENTRATION SENSORS FOR PROCESS CHAMBERS

(71) Applicant: Applied Materials, Inc., Santa Clara, CA (US)

(72) Inventors: William Durand, San Francisco, CA (US); Abdullah Zafar, Santa Clara, CA (US); Usman Chowdhury, Santa Clara, CA (US); Amir Bayati, San Jose, CA (US); Farzad Houshmand, Mountain View, CA (US); David J. Coumou, Webster, NY (US); Kasturi Sarang, San Jose, CA (US); Kenric Choi, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 134 days.

(21) Appl. No.: 18/228,549

(22) Filed: Jul. 31, 2023

(65) Prior Publication Data

US 2025/0043423 A1 Feb. 6, 2025

(51) Int. Cl.
 *C23C 16/455* (2006.01)
 *G01N 21/3504* (2014.01)

(52) U.S. Cl.
 CPC .. *C23C 16/45557* (2013.01); *C23C 16/45544* (2013.01); *G01N 21/3504* (2013.01)

(58) Field of Classification Search
 CPC ........ C23C 16/45557; C23C 16/45544; C23C 16/52; G01N 21/3504
 See application file for complete search history.

(56) References Cited

U.S. PATENT DOCUMENTS

| | | | |
|---|---|---|---|
| 2017/0101715 A1 | 4/2017 | Nishizato et al. | |
| 2020/0041407 A1* | 2/2020 | Huang | C23C 16/448 |
| 2021/0005435 A1* | 1/2021 | Jung | H01J 37/32477 |
| 2021/0134568 A1 | 5/2021 | Ruan et al. | |
| 2021/0280391 A1 | 9/2021 | Spuller et al. | |
| 2022/0328285 A1* | 10/2022 | Zafar | G01N 33/0027 |

OTHER PUBLICATIONS

International Search Report and Written Opinion of the International Searching Authority, or the Declaration for Application No. PCT/US2024/036134, dated Oct. 14, 2024, 11 pages.

* cited by examiner

*Primary Examiner* — Edwin C Gunberg
*Assistant Examiner* — Richard O Toohey
(74) *Attorney, Agent, or Firm* — Schwabe, Williamson & Wyatt, P.C.

(57) ABSTRACT

Vapor concentration sensors for deposition process or deposition chamber condition monitoring are described. In an example, a deposition system includes a deposition chamber, a deposition precursor source coupled to an inlet of the deposition chamber, and a non-dispersive infrared (NDIR) vapor concentration sensor between the deposition precursor source and the deposition chamber.

16 Claims, 12 Drawing Sheets

VAPOR CONCENTRATION SENSORS FOR PROCESS CHAMBERS

BACKGROUND

1) Field

Embodiments of the present disclosure pertain to the field of process monitoring such as to active-cooled mercury cadmium telluride (MCT) non-dispersive infrared (NDIR) vapor concentration sensors in a semiconductor processing chamber for deposition chambers.

2) Description of Related Art

The fabrication of microelectronic devices, display devices, micro-electromechanical systems (MEMS), and the like require the use of one or more processing chambers. For example, processing chambers such as, but not limited to, an atomic layer deposition (ALD) chamber, a plasma enhanced chemical vapor deposition chamber, a physical vapor deposition chamber, or a plasma treatment chamber may be used to fabricate various devices. As scaling continues to drive to smaller critical dimensions in such devices, the need for uniform processing conditions (e.g., uniformity across a single substrate, uniformity between different lots of substrates, and uniformity between chambers in a facility) as well as process stability during the process are becoming more critical in high volume manufacturing (HVM) environments.

Processing non-uniformity and non-stability arise from many different sources. One such source is the concentration variability of vaporized precursors. That is, as substrates are processed in a chamber, the precursor source dosage is reduced.

SUMMARY

Embodiments of the present disclosure include vapor concentration sensors for deposition chambers.

In an embodiment, a deposition system includes a deposition chamber, a deposition precursor source coupled to an inlet of the deposition chamber, and a non-dispersive infrared (NDIR) vapor concentration sensor between the deposition precursor source and the deposition chamber.

In another embodiment, non-dispersive infrared (NDIR) vapor concentration sensor includes a bottom heater, a side heater coupled to the bottom heater, a hot can coupled to the side heater, a carrier gas inlet coupled to the hot can, a detector coupled to the hot can, an NDIR cell body coupled to the detector, a light source coupled to the NDIR cell body, and an outlet coupled to the source.

In another embodiment, a deposition chamber includes a chamber wall surrounding a processing region, a chamber lid over the chamber wall, the chamber lid above the processing region, a chamber floor beneath the chamber wall, the chamber floor below the processing region, and a support pedestal in the processing region, the support pedestal below the chamber lid and above the chamber floor, and the support pedestal surrounded by the chamber wall. One of the chamber wall, the chamber lid, the chamber floor, or the support pedestal includes a non-dispersive infrared (NDIR) vapor concentration sensor therein or thereon.

DETAILED DESCRIPTION

Figure 1:
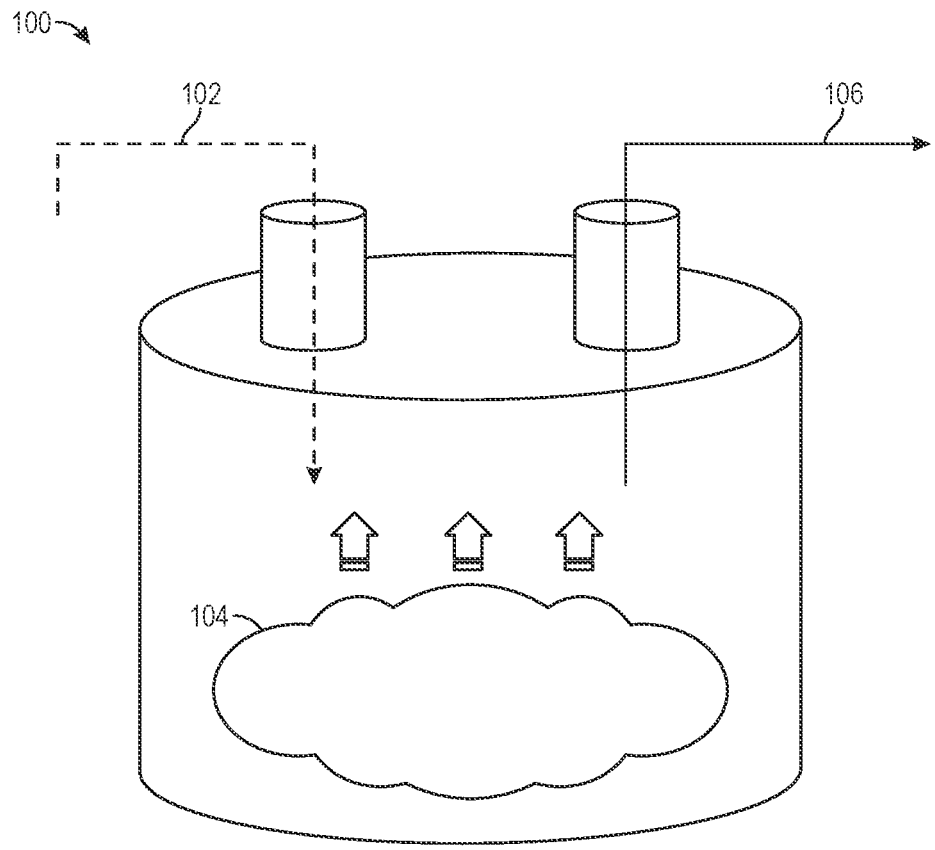
FIG. 1 illustrates a schematic of an ampoule for holding a volatile precursor, in accordance with an embodiment of the present disclosure.

Vapor concentration sensors for processing (e.g., a deposition) chambers are described. In the following description, numerous specific details are set forth, such as chamber configurations and vapor concentration sensor architectures, in order to provide a thorough understanding of embodiments of the present disclosure. It will be apparent to one skilled in the art that embodiments of the present disclosure may be practiced without these specific details. In other instances, well-known aspects, such as quantitative measurements, are not described in detail in order to not unnecessarily obscure embodiments of the present disclosure. Furthermore, it is to be understood that the various embodiments shown in the Figures are illustrative representations and are not necessarily drawn to scale.

One or more embodiments are directed to active-cooled MCT NDIR vapor concentration sensors and systems to monitor deposition process conditions. Embodiments may include a high sensitivity NDIR vapor concentration sensor enabled by an active-cooled HgCdTe (MCT) detector coupled with thermally isolated optical cell.

In accordance with an embodiment of the present disclosure, an active-cooled MCT detector module, a thermally isolated optical cell, and/or a high-speed integrated processing board can be implemented as several distinct hardware optimizations enabling the sensing of low concentrations of vaporized precursors. Minimized detector temperatures can improve performance and operating margins for semiconductor process conditions. A custom controller board can enable the detection of ultra-fast concentration swings existing for fast pulsing recipes (e.g. ALD).

Advantages or improvements for implementing embodiments described herein can include one or more of (1) minimizing thermal transfer to the detector, (2) isolating the thermally sensitive optics, (3) reducing operating temperatures with active cooling, and/or (4) use of high speed integrated processing board.

To provide context, rates of thin-film processes are correlated with precursor concentrations delivered to reactors. Typically, delivered concentration is only inferred from on-wafer thickness or other indirect measurements. Existing sensors suffer from poor signal to noise ratio (SNR), unable to differentiate changes in process conditions or drift. Processes can benefit from a more sensitive optical sensor that can operate at the low pressures, high temperatures, and low concentrations (<1 mol %) typical of semiconductor processes.

To provide further context, typical NDIR sensors employ inexpensive, simple thermopile detectors that perform poorly at elevated temperatures. A multi-stage thermoelectric (TEC) cooler can maintain low thermal noise while operating at conditions that minimize condensation on sensitive optics. The mechanical design improves performance by minimizing thermal transfer to the detector. No known sensors on the market employ such techniques in a commercially suitable design.

Advantages for implementing embodiments described herein can include a >10-20× improvement in accuracy and >200× improvement in sampling rate over state-of-the-art designs. Benefits can include quick turnaround time for hardware/software optimization, algorithm tuning, and optical filter selection for proprietary precursors. In an embodiment, sensors described herein can be integrated with tools for closed-loop feedback control.

It is to be appreciated that deposition/etch rates of thin-film processes are closely correlated with the chemical precursor concentrations delivered to reaction chambers. Currently, existing sensors suffer from poor signal-to-noise ratio (SNR), unable to differentiate changes in process conditions or drift. Therefore, there is a high-value need for a more sensitive optical sensor that can operate at the low pressures, high temperatures, and low concentrations (<1 mol %) typical of semiconductor processes. In accordance with one or more embodiments of the present disclosure, using active-cooled MCT detectors, coupled with several optimizations to the hardware configuration, signal processing, enable a sensor design capable of >10-20× improvements to SNR.

Low-volatility chemical precursors have complex delivery characteristics. FIG. 1 illustrates a schematic of an ampoule for holding a volatile precursor, in accordance with an embodiment of the present disclosure.

Figure 2:
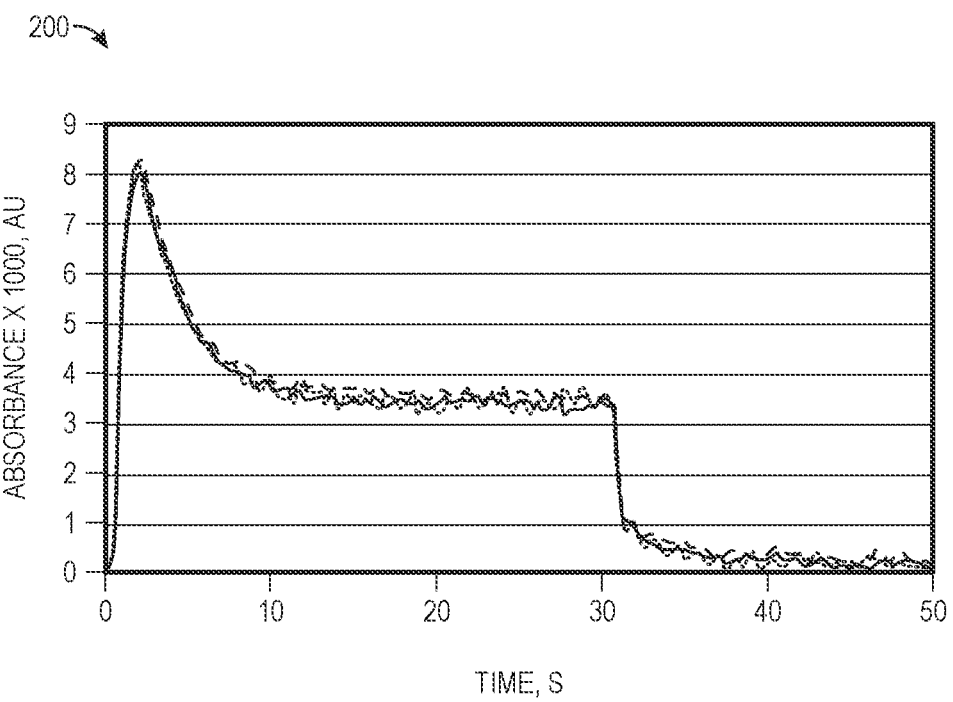
FIG. 2 is a plot of absorbance as a function of time, in accordance with an embodiment of the present disclosure.

Referring to FIG. 1, an ampoule 100 includes a carrier gas inlet 102, a storage area for a volatile precursor 104, and a carrier gas/precursor outlet 106. FIG. 2 is a plot 200 of absorbance as a function of time, e.g., as the amount of volatile precursor 104 decreases.

Figure 3:
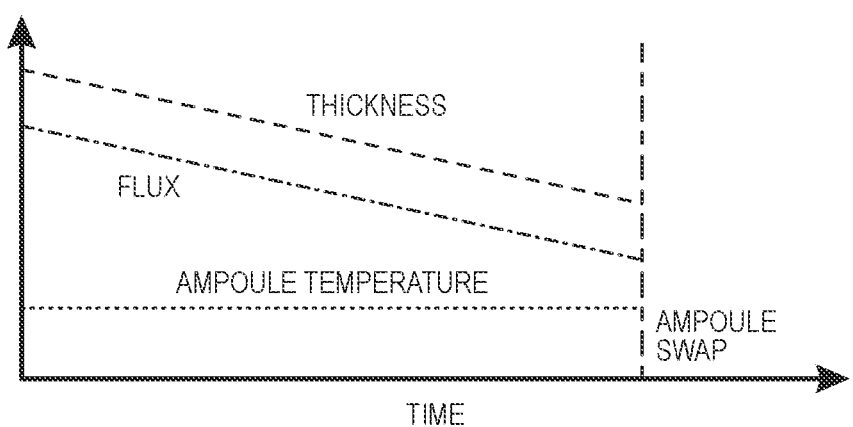
FIG. 3 is a plot of on-film performance as a function of time for a constant ampoule temperature, in accordance with an embodiment of the present disclosure.

Long-term drifts can affect on-film performance. FIG. 3 is a plot 300 of on-film performance as a function of time for a constant ampoule temperature, in accordance with an embodiment of the present disclosure.

It is to be appreciated that FIG. 2 shows an individual pulse showing the varying concentration as a function of time due to the physics of the mass transport—the buildup of vapor in a closed system and the complex dynamics of injecting dry gas and continuous exhaustion of through the ampoule outlet. Contrastingly, FIG. 3 shows long-term performance changes, where the dose (sum total of mass injected to the chamber) decreases as the output from the ampoule changes due to many factors.

Figure 4:
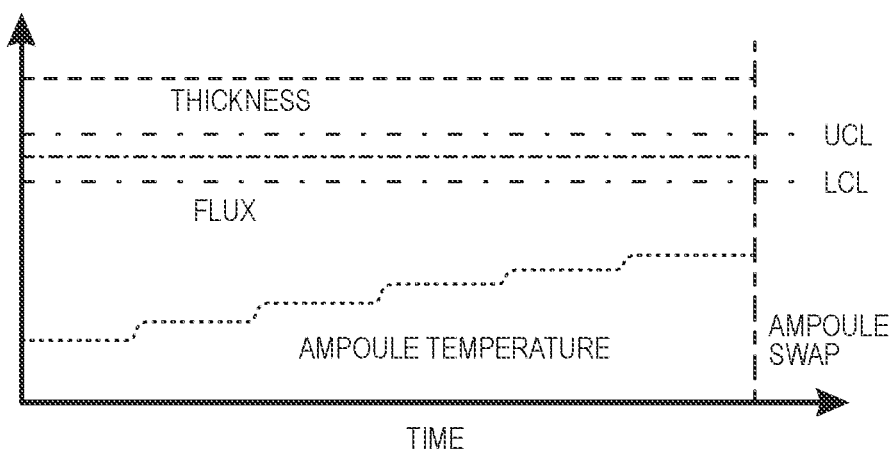
FIG. 4 is a plot of on-film performance as a function of time for an increasing or upward ramping ampoule temperature, in accordance with an embodiment of the present disclosure.

Processing efficiency can demand improved productivity, improved yield, and improved ampoule utilization (e.g., precursor availability optimization). FIG. 4 is a plot 400 of on-film performance as a function of time for an increasing or upward ramping ampoule temperature, in accordance with an embodiment of the present disclosure.

Figure 5:
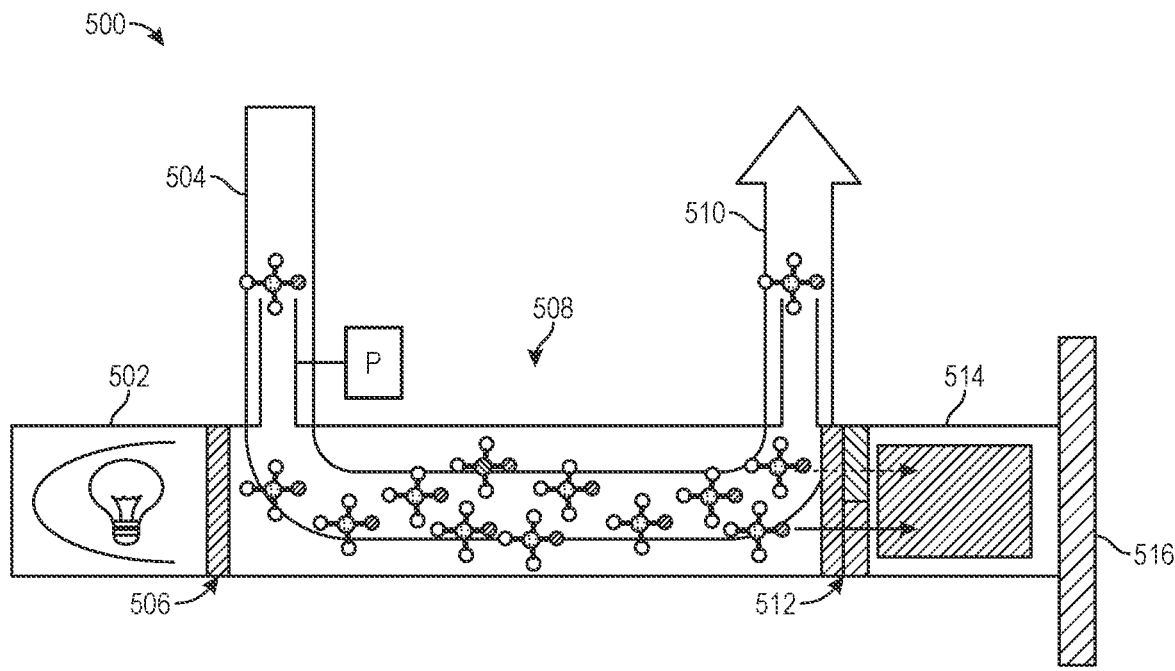
FIG. 5 illustrates a schematic of an NDIR system, in accordance with an embodiment of the present disclosure.

Non-dispersive infrared (NDIR) optical absorption can be implemented to perform vapor concentration sensing. FIG. 5 illustrates a schematic of an NDIR system, in accordance with an embodiment of the present disclosure.

Figure 6:
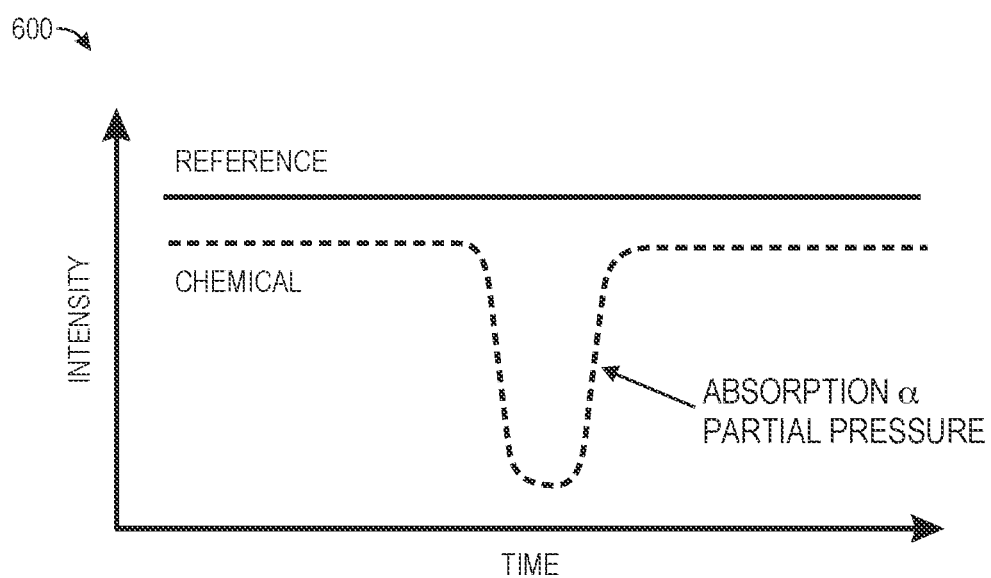
FIG. 6 is a plot of intensity as a function of time for a reference and for a chemical.

Referring to FIG. 5, an NDIR optical absorption system 500 includes a blackbody emitter 502, an inlet 504, a window 506, a cell 508, an outlet 510, an optical filter 512, a photo-detector, 514, and a printed circuit board (PCB) 516. It is to be appreciated that, in this case, two unique filters are chosen and monitored simultaneously, and where described in FIG. 6 as the reference and chemical channels FIG. 6 is a plot 600 of intensity as a function of time for a reference and for a chemical. In an embodiment, an optical signal is converted to absorbance. Intensity of a pulse is proportional to concentration. Pressure/temperature readings allow conversion to mol %. Integrated concentration reading is proportional to the delivered dose.

An NDIR solution can include an active-cooled detector module, a thermally isolated detector, and/or a high speed, integrated processing board. An NDIR solution can provide quick development turnaround time. An NDIR solution can provide closed loop control with ampoule temperature maintains steady flux. As an exemplary NDIR solution, FIG. 7 illustrates a schematic of a vapor concentrationdelivery system, in accordance with an embodiment of the present disclosure.

Figure 7:
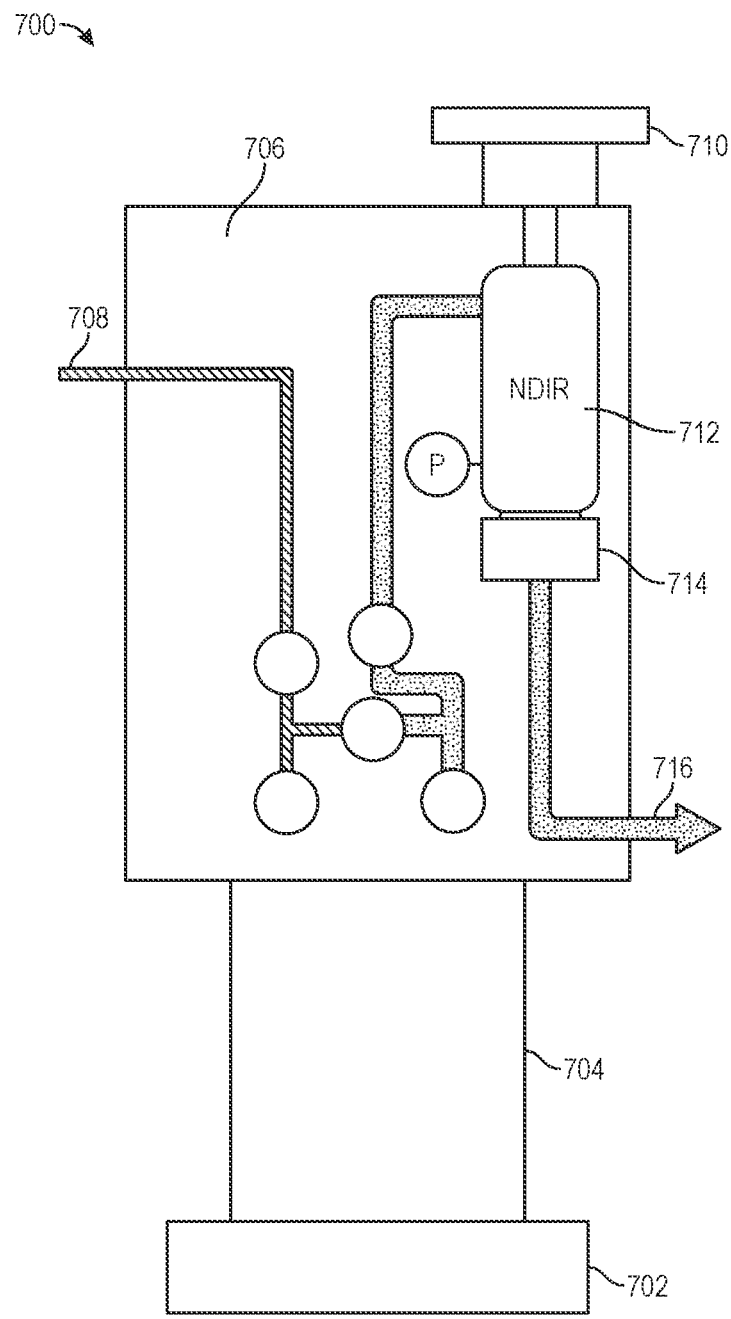
FIG. 7 illustrates a schematic of a vapor concentration sensor, in accordance with an embodiment of the present disclosure.

Referring to FIG. 7, a vapor concentrationdelivery system 700 includes a bottom heater 702, a side heater 704, a hot can 706, a carrier gas inlet 708, a detector 710 which can include a PCB, a cell body 712, a light source 714, and an outlet 716 to chamber.

Figure 8:
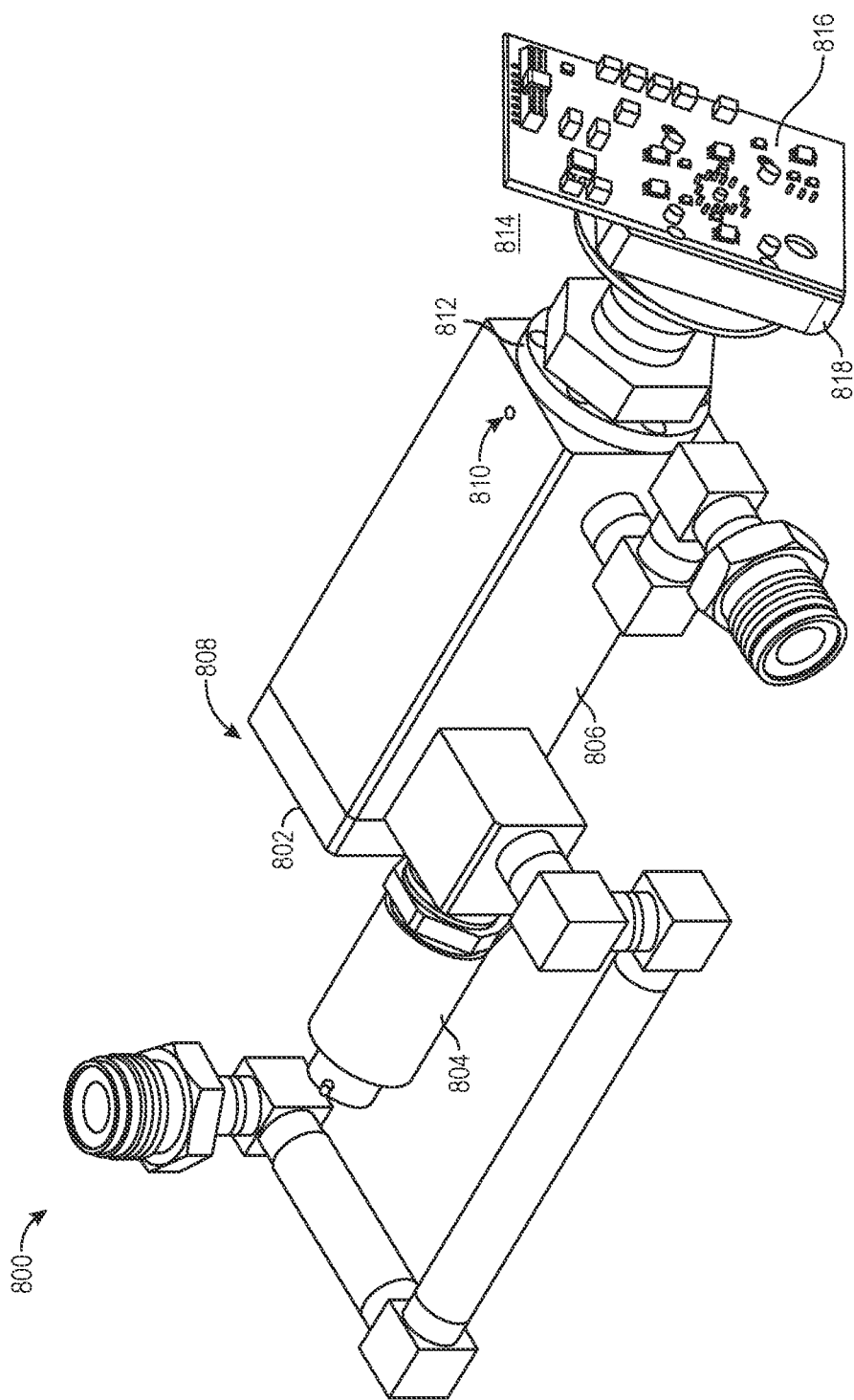
FIG. 8 illustrates and angled view of an NDIR sensor module, in accordance with an embodiment of the present disclosure.

As an exemplary sensor, FIG. 8 illustrates and angled view of an NDIR sensor module, in accordance with an embodiment of the present disclosure.

Referring to FIG. 8, an NDIR sensor module 800 includes an IR emitter 802, a pressure sensor 804, a weldment body 806, an end plate source 808, an RTD mounting hole 810, an end plate detector 812, an adaptor 814, an IR detector PCB 816, and an IR detector 818.

Figure 9:
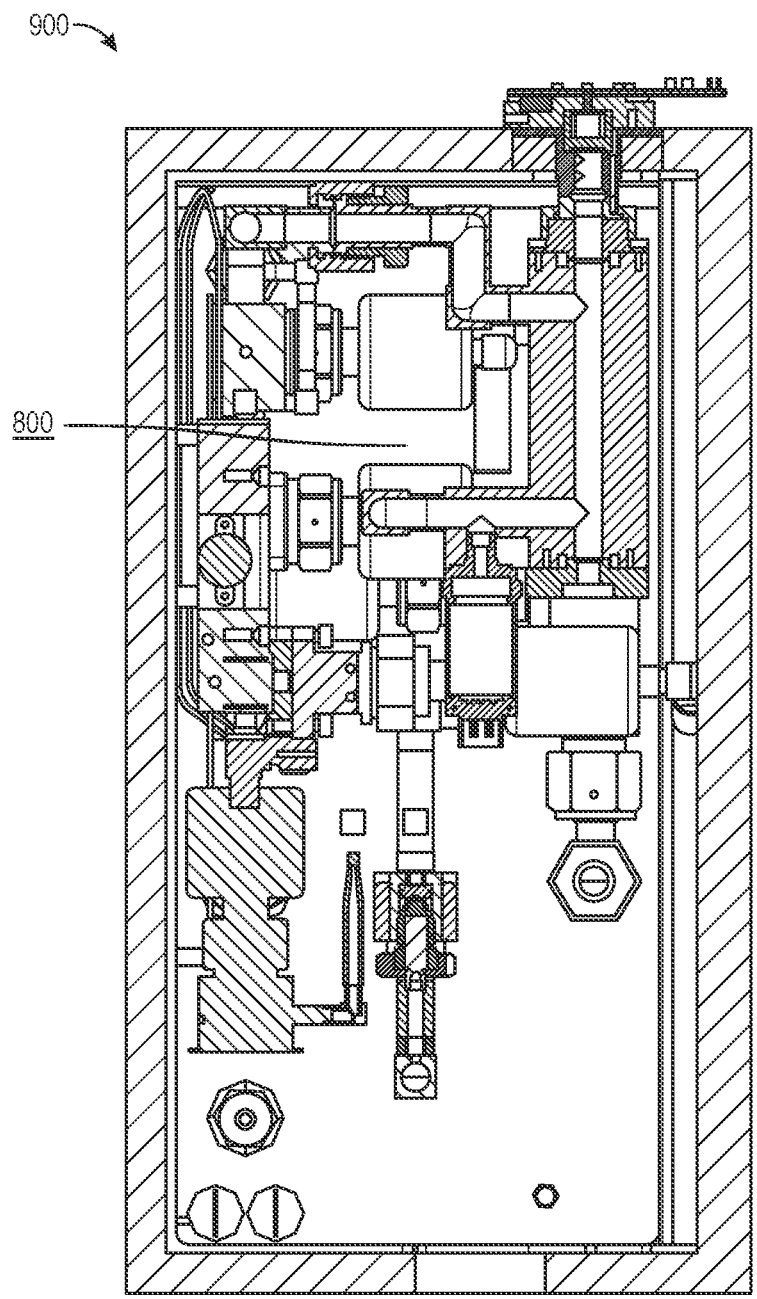
FIG. 9 is a cross-sectional view of a hot can integration of the NDIR sensor module of FIG. 8, in accordance with an embodiment of the present disclosure.

As an exemplary implementation, FIG. 9 is a cross-sectional view of a hot can 900 integration of the NDIR sensor module 800 of FIG. 8, in accordance with an embodiment of the present disclosure. In an embodiment, the hot can 900 is designed for inclusion in a processing tool upstream from the deposition chamber.

It is to be appreciated that the above embodiments describe vapor concentration sensors that are included upstream of a deposition chamber. In other embodiments, the vapor concentration sensors can be included in one or more locations throughout the chamber to monitor the vapor concentration at various locations, which then can be correlated to overall process performances such as deposition rate, deposition non-uniformity, process drifting, etc.

Figure 10:
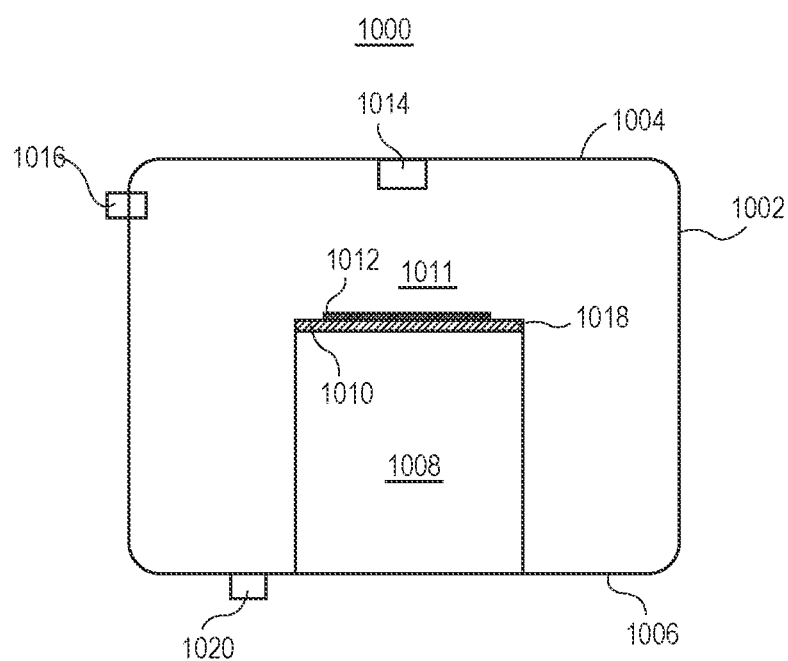
FIG. 10 illustrates a cross-section view of a deposition chamber including one or more vapor concentration sensors, in accordance with an embodiment of the present disclosure.

FIG. 10 illustrates a cross-section view of a deposition chamber including one or more vapor concentration sensors, in accordance with an embodiment of the present disclosure.

Referring to FIG. 10, a deposition chamber 1000 includes a chamber wall 1002 surrounding a processing region 1011. A wafer or substrate 1012 can be processed in the processing region 1011. A chamber lid 1004 is over the chamber wall 1002, the chamber lid 1004 above the processing region 1011. A chamber floor 1006 is beneath the chamber wall 1002, the chamber floor 1006 below the processing region 1011. A support pedestal 1008 is in the processing region 1011 (and, more particularly, can include a support surface 1010 in the processing region 1011). The support pedestal 1008 is below the chamber lid 1004 and above the chamber floor 1006, and is surrounded by the chamber wall 1004.

Referring again to FIG. 10, in an embodiment, the chamber 1004 wall has an opening there through. A vapor concentration sensor module 1016 is in the opening of the chamber wall 1004. In another embodiment, the chamber lid 1004 includes a vapor concentration module 1014. In another embodiment, the chamber floor 1006 includes an evacuation port. A vapor concentration sensor module 1020 is within or adjacent to the evacuation port. In another embodiment, the support pedestal includes a ring structure (e.g., at location 1018) surrounding a substrate support region. The ring structure includes an opening there through. A vapor concentration sensor module is in the opening of the ring structure. In an embodiment, a deposition chamber 1000 includes one or more of a vapor concentration sensor module 1016 in the opening of the chamber wall 1004, a vapor concentration sensor module 1014 in the chamber lid 1004, a vapor concentration sensor module within or adjacent to an evacuation port 1020 of the chamber floor 1006, and/or a vapor concentration sensor module is in the opening of the ring structure, e.g., at location 1018. A vapor concentration sensor system can include a sensor module, interface electronics, a controller, and integration with chamber data server for process control and data/process synchronization.

Different locations for a vapor concentration sensor module may be implemented by making modifications to the various components of the sensor housing assembly and/or by modifying how the components interface with the chamber itself. For example, in the case of a chamber wall sensor, a shaft may extend through a port in the chamber wall and the vacuum electrical feedthrough may be external to the chamber. In the case of a lid sensor, a shaft may extend out from the lid into the chamber, and the vacuum electrical feedthrough may be embedded in the lid. In the case of a process ring sensor, a shaft may extend up from a bottom chamber surface and intersect a plasma screen that is adjacent to the process ring. In such embodiments, a vacuum electrical feedthrough may be positioned within a port through the bottom chamber surface. In the case of an evacuation region sensor, the shaft may be inserted through a port through a chamber wall, and the vacuum electrical feedthrough may be outside the chamber wall. In some embodiments, an adapter may be fitted around portions of the vapor concentration sensor housing assembly in order to provide a hermetic seal along ports with any dimension.

In some embodiments, portions of the vapor concentration sensor assembly may be considered a consumable component. For example, the vapor concentration sensor module may be replaced after a certain period of time or after significant sensor drift is detected. The vapor concentration sensor housing assembly may be easily disassembled to allow for simple replacement. In a particular embodiment, a shaft may have a threaded end that screws into a main housing that is attached to the vacuum electrical feedthrough. As such, the shaft and other components attached to the shaft (e.g., the cap and the sensor module) may be removed and replaced by screwing a new shaft to the main housing. In other embodiments, the entire sensor assembly may be considered a consumable component, and the entire sensor assembly may be replaced after a certain period of time or after significant vapor concentration sensor drift is detected.

Providing vapor concentration sensor modules, such as those described herein, within a processing apparatus can allow for chamber conditions to be monitored during the execution of various processing recipes, during transitions between substrates, during cleaning operations (e.g., ICC operations), during chamber validation, or during any other desired time. Furthermore, the architecture of the vapor concentration sensor modules disclosed herein allows for integration in many different locations. Such flexibility allows for many different components of a processing apparatus to be monitored simultaneously in order to provide enhanced abilities to determine the cause of chamber drift. For example, FIG. 11 provides a schematic of a deposition apparatus 1100 that includes the integration of vapor concentration sensor modules 1111 in various locations.

Figure 11:
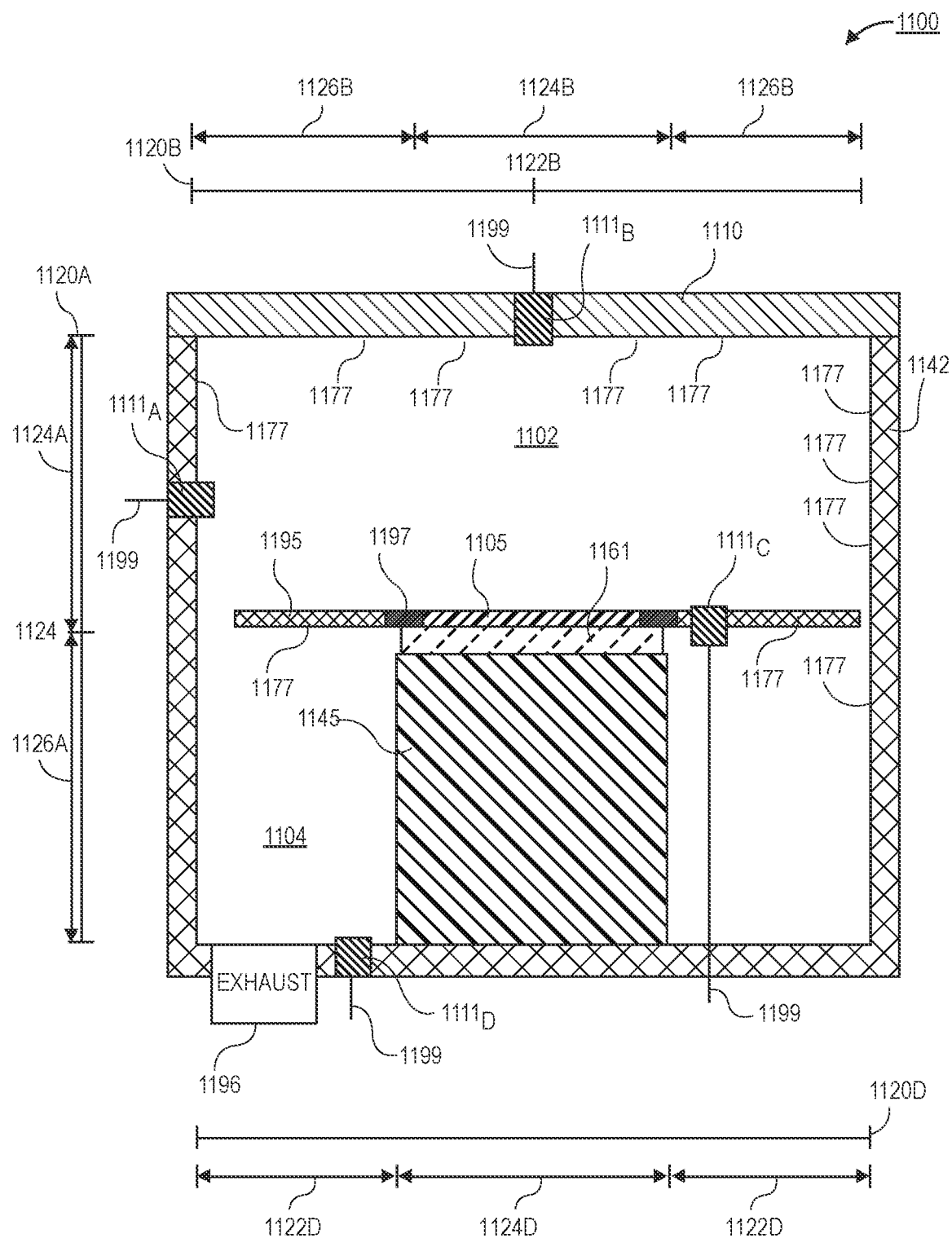
FIG. 11 provides a schematic of a deposition apparatus that includes the integration of vapor concentration sensor modules in various locations, in accordance with an embodiment of the present disclosure.

As shown, in FIG. 11, the processing apparatus 1100 may include a chamber 1142. A cathode liner 1145 may surround a lower electrode 1161. A substrate 1105 may be secured to the lower electrode 1161. A process ring 1197 may surround the substrate 1105, and a plasma screen 1195 may surround the process ring 1197. In an embodiment, a lid assembly 1110 may seal the chamber 1142. The chamber 1142 may include a processing region 1102 and an evacuation region 1104. The evacuation region 1104 may be proximate to an exhaust port 1196.

In some embodiments, a sidewall sensor module 1111A may be located along a sidewall of the chamber 1142. In some embodiments, the sidewall sensor module 1111A passes through the wall of the chamber 1142 and is exposed to the processing region 1102. In some embodiments, a lid sensor module 1111B is integrated with the lid assembly 1110 and faces the processing region 1102. In some embodiments, a process ring sensor module 1111c is positioned adjacent to the process ring 1197. For example, the process ring sensor module 1111c may be integrated with the plasma screen 1195 that surrounds the process ring 1197. In yet another embodiment, an evacuation region sensor module 1111p may be located in the evacuation region 1104. For example, the evacuation region sensor module 1111p may pass through a bottom surface of the chamber 1142. As shown, each of the sensor modules 1111 includes an electrical lead 1199 that exits the chamber 1142. As such, real time monitoring with the sensor modules 1111 may be implemented.

In an embodiment, sidewall sensor module 1111A is in a location 1120A along a side of chamber 1142. In one embodiment, sidewall sensor module 1111A is in a location 1122A laterally adjacent to a substrate 1105 support region of the lower electrode 1161. In one embodiment, sidewall sensor module 1111A is in a location 1124A vertically between a substrate 1105 support region of the lower electrode 1161 and the lid assembly 1110. In one embodiment, sidewall sensor module 1111A is in a location 1126A vertically between a substrate 1105 support region of the lower electrode 1161 and a floor of the processing apparatus 1100.

In an embodiment, lid sensor module 1111B is in a location 1120B along lid assembly 1110. In one embodiment, lid sensor module 1111B is in a location 1122B coaxial with substrate 1105 support region of the lower electrode 1161. In one embodiment, lid sensor module 1111B is in a location 1124B vertically over substrate 1105 support region of the lower electrode 1161. In one embodiment, lid sensor module 1111B is in a location 1126B vertically over a region outside of substrate 1105 support region of the lower electrode 1161.

In an embodiment, process ring sensor module 1111c is in an inner periphery of plasma screen 1195. In another embodiment, process ring sensor module 1111c is in an outer periphery of plasma screen 1195.

In an embodiment, the evacuation region sensor module 1111p is in a location 1120D along a bottom surface of the chamber 1142. In one embodiment, the evacuation region sensor module 1111p is in a location 1122D vertically beneath a region outside of a substrate support region of the lower electrode 1161. In one embodiment, the evacuation region sensor module 1111p is in a location 1124D vertically beneath a substrate support region of the lower electrode 1161.

Additional exemplary sensor locations are designated as 1177, and are not intended to be limiting in any way.

Figure 12A:
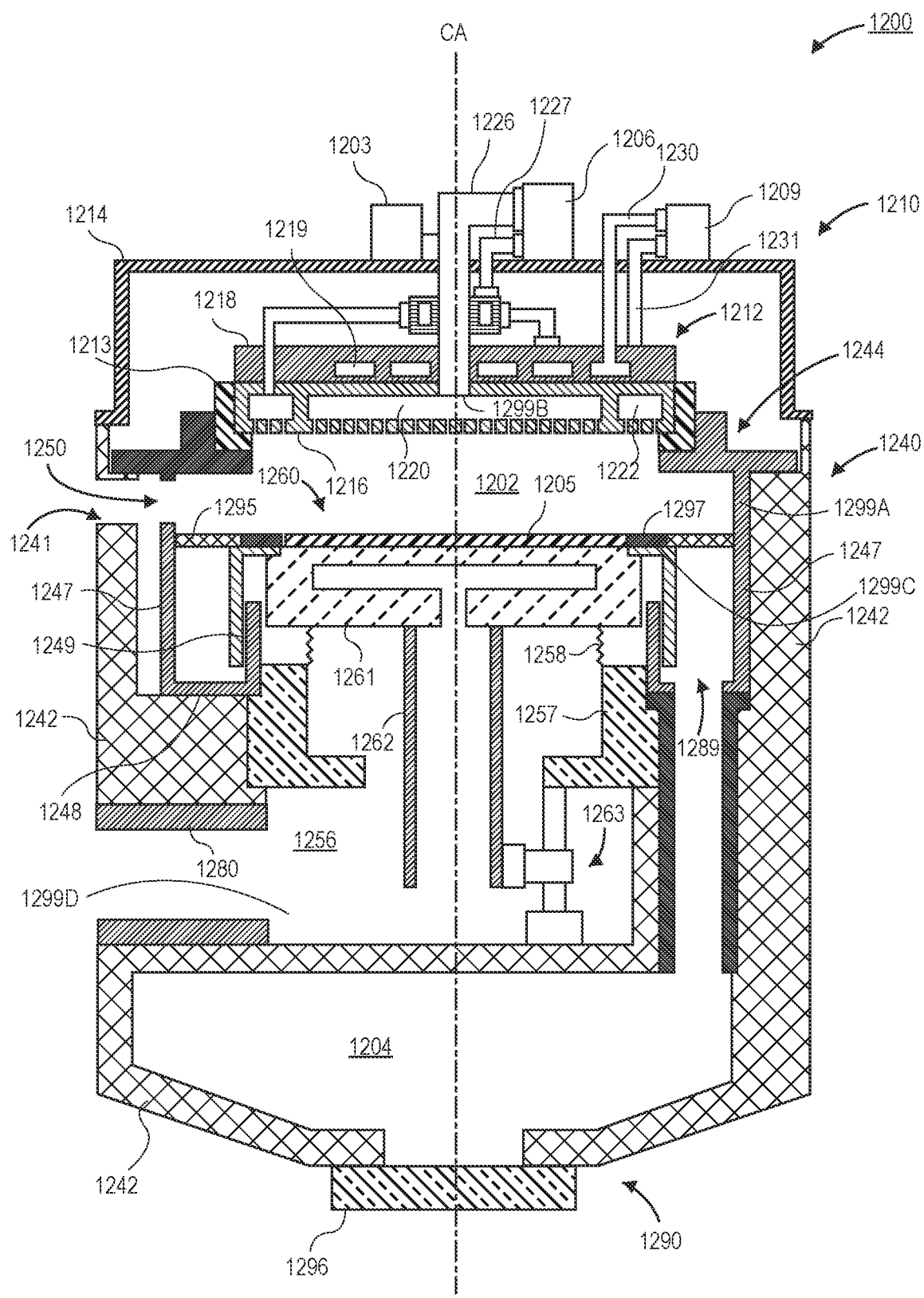
FIG. 12A is a schematic, cross-sectional view of a plasma processing apparatus that includes one or more vapor concentration sensor modules, in accordance with an embodiment of the present disclosure.

FIG. 12A is a schematic, cross-sectional view of a deposition apparatus 1200 that includes one or more vapor concentration sensor modules, such as those described herein according to an embodiment. The plasma processing apparatus 1200 may be a plasma enhanced chemical vapor deposition chamber, a physical vapor deposition chamber, a plasma treatment chamber, an atomic layer deposition (ALD) chamber, an atomic layer etch (ALE) chamber, or other suitable vacuum processing chamber. As shown in FIG. 12A, the plasma processing apparatus 1200 generally includes a chamber lid assembly 1210, a chamber body assembly 1240, and an exhaust assembly 1290, which collectively enclose a processing region 1202 and an evacuation region 1204. In practice, processing gases are introduced into the processing region 1202 and ignited into a plasma using RF power. A substrate 1205 is positioned on a substrate support assembly 1260 and exposed to the plasma generated in the processing region 1202 to perform a plasma process on the substrate 1205, such as etching, chemical vapor deposition, physical vapor deposition, implantation, plasma annealing, plasma treating, abatement, or other plasma processes. Vacuum is maintained in the processing region 1202 by the exhaust assembly 1290, which removes spent processing gases and byproducts from the plasma process through the evacuation region 1204.

The lid assembly 1210 generally includes an upper electrode 1212 (or anode) isolated from and supported by the chamber body assembly 1240 and a chamber lid 1214 enclosing the upper electrode 1212. The upper electrode 1212 is coupled to an RF power source 1203 via a conductive gas inlet tube 1226. The conductive gas inlet tube 1226 is coaxial with a central axis of the chamber body assembly 1240 so that both RF power and processing gases are symmetrically provided. The upper electrode 1212 includes a showerhead plate 1216 attached to a heat transfer plate 1218. The showerhead plate 1216, the heat transfer plate 1218, and the gas inlet tube 1226 are all fabricated from an RF conductive material, such as aluminum or stainless steel.

The showerhead plate 1216 has a central manifold 1220 and one or more outer manifolds 1222 for distributing processing gasses into the processing region 102. The one or more outer manifolds 1222 circumscribe the central manifold 1220. The central manifold 1220 receives processing gases from a gas source 1206 through the gas inlet tube 1226, and the outer manifold(s) 1222 receives processing gases, which may be the same or a different mixture of gases received in the central manifold 1220, from the gas source 1206 through gas inlet tube(s) 1227. The dual manifold configuration of the showerhead plate 1216 allows improved control of the delivery of gases into the processing region 1202. The multi-manifold showerhead plate 116 enables enhanced center to edge control of processing results as opposed to conventional single manifold versions.

A heat transfer fluid is delivered from a fluid source 1209 to the heat transfer plate 1218 through a fluid inlet tube 1230. The fluid is circulated through one or more fluid channels 1219 disposed in the heat transfer plate 1218 and returned to the fluid source 1209 via a fluid outlet tube 1231. Suitable heat transfer fluids include water, water-based ethylene glycol mixtures, a perfluoropolyether (e.g., Galden® fluid), oil-based thermal transfer fluids, or similar fluids.

The chamber body assembly 1240 includes a chamber body 1242 fabricated from a conductive material resistant to processing environments, such as aluminum or stainless steel. The substrate support assembly 1260 is centrally disposed within the chamber body 1242 and positioned to support the substrate 1205 in the processing region 1202 symmetrically about the central axis (CA). The substrate support assembly 1260 may also support a process ring 1297 that surrounds the substrate 1205. The chamber body 1242 includes a ledge that supports an outer flange of an upper liner assembly 1244. The upper liner assembly 1244 may be constructed from a conductive, process compatible material, such as aluminum, stainless steel, and/or yttria (e.g., yttria coated aluminum). In practice, the upper liner assembly 1244 shields the upper portion of the chamber body 1242 from the plasma in the processing region 1202 and is removable to allow periodic cleaning and maintenance. An inner flange of the upper liner assembly 1244 supports the upper electrode 1212. An insulator 1213 is positioned between the upper liner assembly 1244 and the upper electrode 1212 to provide electrical insulation between the chamber body assembly 1240 and the upper electrode 1212.

The upper liner assembly 1244 includes an outer wall 1247 attached to the inner and outer flanges, a bottom wall 1248, and an inner wall 1249. The outer wall 1247 and inner wall 1249 are substantially vertical, cylindrical walls. The outer wall 1247 is positioned to shield chamber body 1242 from plasma in the processing region 1202, and the inner wall 1249 is positioned to at least partially shield the side of the substrate support assembly 1260 from plasma in the processing region 1202. The bottom wall 1248 joins the inner and outer walls (1249, 1247) except in certain regions where evacuation passages 1289 are formed.

The processing region 1202 is accessed through a slit valve tunnel 1241 disposed in the chamber body 1242 that allows entry and removal of the substrate 1205 into/from the substrate support assembly 1260. The upper liner assembly 1244 has a slot 1250 disposed there through that matches the slit valve tunnel 1241 to allow passage of the substrate 1205 there through. A door assembly (not shown) closes the slit valve tunnel 1241 and the slot 1250 during operation of the plasma processing apparatus.

The substrate support assembly 1260 generally includes lower electrode 1261 (or cathode) and a hollow pedestal 1262, the center of which the central axis (CA) passes through, and is supported by a central support member 1257 disposed in the central region 1256 and supported by the chamber body 1242. The central axis (CA) also passes through the center of the central support member 1257. The lower electrode 1261 is coupled to the RF power source 1203 through a matching network (not shown) and a cable (not shown) routed through the hollow pedestal 1262. When RF power is supplied to the upper electrode 1212 and the lower electrode 1261, an electrical field formed there between ignites the processing gases present in the processing region 1202 into a plasma.

The central support member 1257 is sealed to the chamber body 1242, such as by fasteners and O-rings (not shown), and the lower electrode 1261 is sealed to the central support member 1257, such as by a bellows 1258. Thus, the central region 1256 is sealed from the processing region 1202 and may be maintained at atmospheric pressure, while the processing region 1202 is maintained at vacuum conditions.

An actuation assembly 1263 is positioned within the central region 1256 and attached to the chamber body 1242 and/or the central support member 1257. The actuation assembly 1263 provides vertical movement of the lower electrode 161 relative to the chamber body 142, the central support member 1257, and the upper electrode 1212. Such vertical movement of the lower electrode 1261 within the processing region 1202 provides a variable gap between the lower electrode 1261 and the upper electrode 1212, which allows increased control of the electric field formed there between, in turn, providing greater control of the density in the plasma formed in the processing region 1202. In addition, since the substrate 1205 is supported by the lower electrode 1261, the gap between the substrate 1205 and the showerhead plate 1216 may also be varied, resulting in greater control of the process gas distribution across the substrate 1205.

In one embodiment, the lower electrode 1261 is an electrostatic chuck, and thus includes one or more electrodes (not shown) disposed therein. A voltage source (not shown) biases the one or more electrodes with respect to the substrate 1205 to create an attraction force to hold the substrate 1205 in position during processing. Cabling coupling the one or more electrodes to the voltage source is routed through the hollow pedestal 1262 and out of the chamber body 1242 through one of the plurality of access tubes 1280.

Figure 12B:
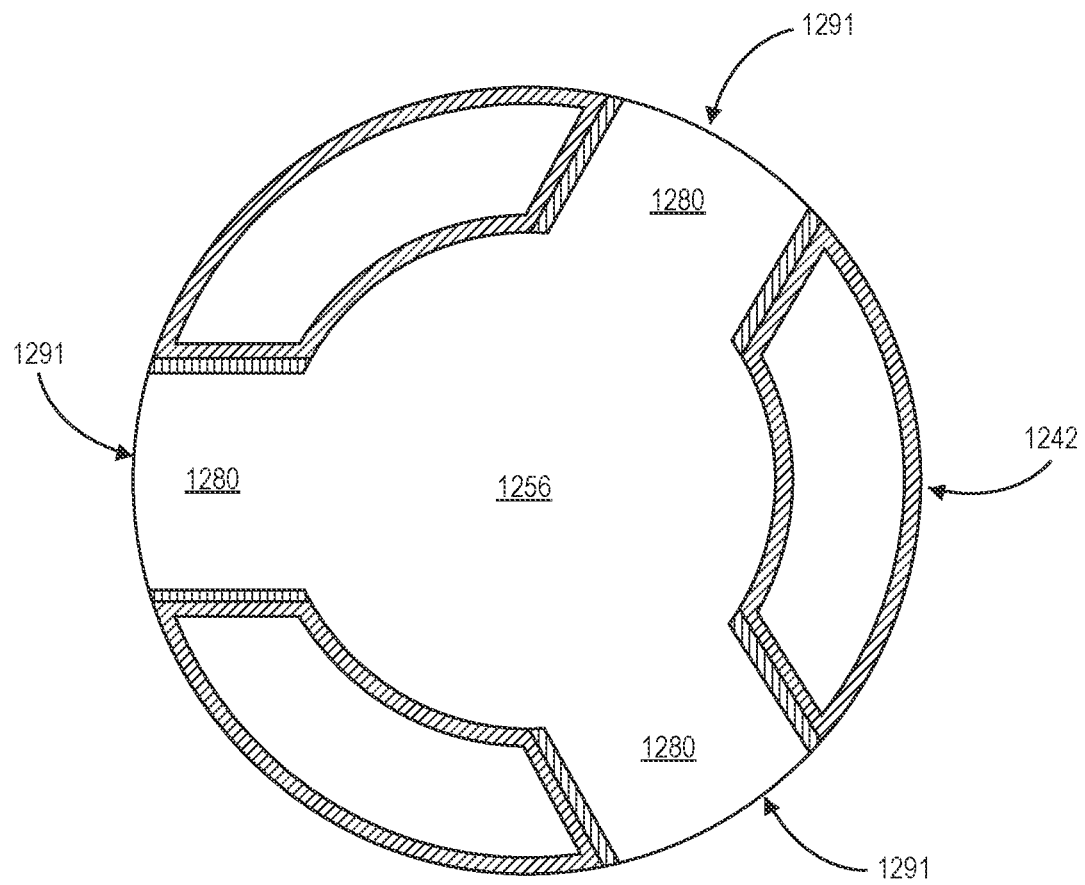
FIG. 12B is a schematic depiction of a layout of the access tubes within spokes of a chamber body assembly of the plasma processing apparatus of FIG. 12A, in accordance with an embodiment of the present disclosure.

FIG. 12B is a schematic depiction of the layout of the access tubes 1280 within spokes 1291 of the chamber body assembly 1240. The spokes 1291 and access tubes 1280 are symmetrically arranged about the central axis (CA) of the processing apparatus 1200 in a spoke pattern as shown. In the embodiment shown, three identical access tubes 1280 are disposed through the chamber body 1242 into the central region 1256 to facilitate supply of a plurality of tubing and cabling from outside of the chamber body 1242 to the lower electrode 1261. Each of the spokes 1291 are adjacent to an evacuation passage 1289 that fluidically couples the processing region 1202 above the central region 1256 to the evacuation region 1204 below the central region 1256. The symmetrical arrangement of the access tubes 1280 further provides electrical and thermal symmetry in the chamber body 1242, and particularly in the processing region 1202, in order to allow greater more uniform plasma formation in the processing region 1202 and improved control of the plasma density over the surface of the substrate 1205 during processing.

Similarly, the evacuation passages 1289 are positioned in the upper liner assembly 1244 symmetrically about the central axis (CA). The evacuation passages 1289 allow evacuation of gases from the processing region 1202 through the evacuation region 1204 and out of the chamber body 1242 through an exhaust port 1296. The exhaust port 1296 is centered about the central axis (CA) of the chamber body assembly 1240 such that the gases are evenly drawn through the evacuation passages 1289.

Referring again to FIG. 12A, a conductive, mesh liner 1295 is positioned on the upper liner assembly 1244. The mesh liner 1295 may be constructed from a conductive, process compatible material, such as aluminum, stainless steel, and/or yttria (e.g., yttria coated aluminum). The mesh liner 1295 may have a plurality of apertures (not shown) formed there through. The apertures may be positioned symmetrically about a center axis of the mesh liner 1295 to allow exhaust gases to be drawn uniformly there through, which in turn, facilitates uniform plasma formation in the processing region 1202 and allows greater control of the plasma density and gas flow in the processing region 1202. In one embodiment, the central axis of the mesh liner 1295 is aligned with the central axis (CA) of the chamber body assembly 1240.

The mesh liner 1295 may be electrically coupled to the upper liner assembly 1244. When an RF plasma is present within the processing region 1202, the RF current seeking a return path to ground may travel along the surface of the mesh liner 1295 to the outer wall 1247 of the upper liner assembly 1244. Thus, the annularly symmetric configuration of the mesh liner 1295 provides a symmetric RF return to ground and bypasses any geometric asymmetries of the upper liner assembly 1244.

In an embodiment, one or more vapor concentration sensor modules may be located at various locations throughout the processing apparatus 1200. For example, a sensor module (or a portion of the sensor module) may be located in one or more locations, such as, but not limited to, along a sidewall of the chamber 1242, in the evacuation region 1204, adjacent to the process ring 1297 (e.g., integrated into the mesh liner 1295), or integrated with the lid assembly 1210. Accordingly, detection of various deposition conditions in multiple locations through the processing apparatus 1200 may be determined. The chamber conditions supplied by the one or more sensor modules may be used to modify one or more parameters, such as, for example, processing recipe parameters, cleaning schedules for the processing apparatus 1200, component replacement determinations, and the like.

In an embodiment, the processing apparatus 1200 includes a chamber wall vapor concentration sensor module, e.g., at a location 1299A. In an embodiment, the processing apparatus 1200 includes a chamber lid vapor concentration sensor module, e.g., at a location 1299B. In an embodiment, the processing apparatus 1200 includes a chamber floor or evacuation port vapor concentration sensor module within or adjacent to an evacuation port, e.g., at a location 1299D. In an embodiment, the processing apparatus 1200 includes a ring structure vapor concentration sensor module, e.g., at a location 1299C.

In an embodiment, the processing apparatus 1200 includes two or more different vapor concentration sensors selected from the group consisting of a chamber wall vapor concentration sensor module, a chamber lid vapor concentration sensor module, a chamber floor or evacuation port vapor concentration sensor module, a ring structure vapor concentration sensor module. In an embodiment, the processing apparatus 1200 includes two or more same vapor concentration sensors selected from the group consisting of a chamber wall vapor concentration sensor module, a chamber lid vapor concentration sensor module, a chamber floor or evacuation port vapor concentration sensor module, a ring structure vapor concentration sensor module.

In an embodiment, one or more of the chamber wall vapor concentration sensor module, the chamber lid vapor concentration sensor module, the chamber floor or evacuation port vapor concentration sensor module, and/or the ring structure vapor concentration sensor module further includes a thermal sensor. In one embodiment, such a chamber wall vapor concentration sensor module, chamber lid vapor concentration sensor module, or chamber floor or evacuation port vapor concentration sensor module includes a vapor concentration sensor proximate the processing region 1202, and includes the thermal sensor distal from the processing region 1202. In one embodiment, the ring structure vapor concentration sensor module includes a vapor concentration sensor proximate a substrate 1205 support region, and includes the thermal sensor distal from the substrate 1205 support region.

While the processing apparatus 1200 in FIGS. 12A and 12B provides a specific example of a tool that may benefit from the inclusion of sensor modules such as those disclosed herein, it is to be appreciated that embodiments are not limited to the particular construction of FIGS. 12A and 12B. That is, many different plasma chamber constructions, such as, but not limited to those used in the microelectronic fabrication industry, may also benefit from the integration of sensor modules, such as those disclosed herein.

Figure 13:
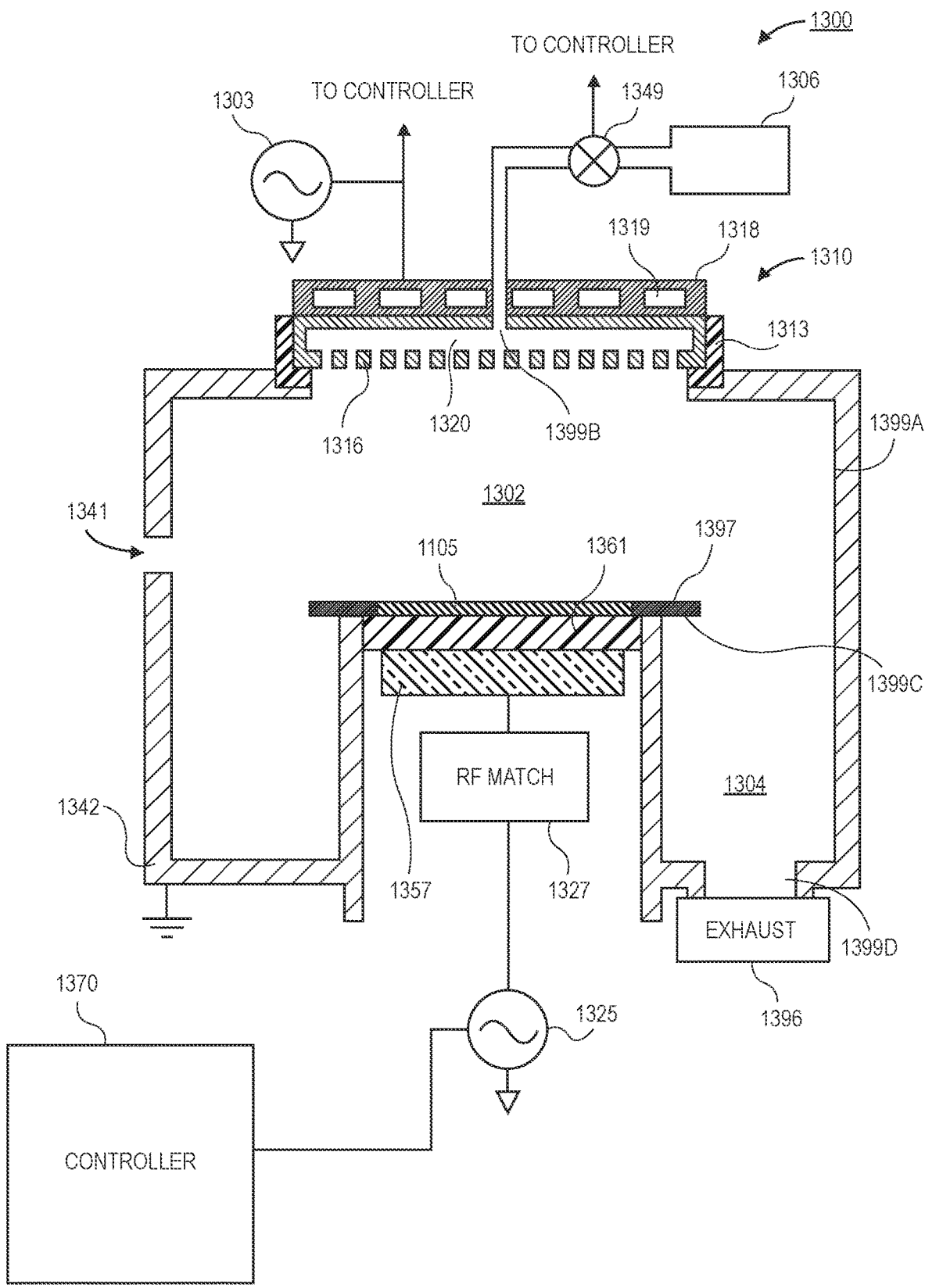
FIG. 13 is a cross-sectional illustration of a deposition apparatus that can include one or more vapor concentrations sensor modules, in accordance with an embodiment of the present disclosure.

For example, FIG. 13 is a cross-sectional illustration of a deposition apparatus 1300 that can include one or more vapor concentration sensor modules such as those described above, in accordance with an embodiment. The plasma processing apparatus 1300 may be a plasma enhanced chemical vapor deposition chamber, a physical vapor deposition chamber, a plasma treatment chamber, an atomic layer deposition (ALD) chamber, or other suitable vacuum processing chamber.

Processing apparatus 1300 includes a grounded chamber 1342. In some instances, the chamber 1342 may also include a liner (not shown) to protect the interior surfaces of the chamber 1342. The chamber 1342 may include a processing region 1302 and an evacuation region 1304. The chamber 1342 may be sealed with a lid assembly 1310. Process gases are supplied from one or more gas sources 1306 through a mass flow controller 1349 to the lid assembly 1310 and into the chamber 1305. An exhaust port 1396 proximate to the evacuation region 1304 may maintain a desired pressure within the chamber 1342 and remove byproducts from processing in the chamber 1342.

The lid assembly 1310 generally includes an upper electrode including a showerhead plate 1316 and a heat transfer plate 1318. The lid assembly 1310 is isolated from the chamber 1342 by an insulating layer 1313. The upper electrode is coupled to a source RF generator 1303 through a match (not shown). Source RF generator 1303 may have a frequency between 100 and 180 MHz, for example, and in a particular embodiment, is in the 162 MHz band. The gas from the gas source 1306 enters into a manifold 1320 within the showerhead plate 1316 and exits into processing region 1302 of the chamber 1342 through openings into the showerhead plate 1316. In an embodiment, the heat transfer plate 1318 includes channels 1319 through which heat transfer fluid is flown. The showerhead plate 1316 and the heat transfer plate 1318 are fabricated from an RF conductive material, such as aluminum or stainless steel. In certain embodiments, a gas nozzle or other suitable gas distribution assembly is provided for distribution of process gases into the chamber 1342 instead of (or in addition to) the showerhead plate 1316.

The processing region 1302 may include a lower electrode 1361 onto which a substrate 1305 is secured. Portions of a process ring 1397 that surrounds the substrate 1305 may also be supported by the lower electrode 1361. The substrate 1305 may be inserted into (or extracted from) the chamber 1342 through a slit valve tunnel 1341 through the chamber 1342. A door for the slit valve tunnel 1341 is omitted for simplicity. The lower electrode 1361 may be an electrostatic chuck. The lower electrode 1361 may be supported by a support member 1357. In an embodiment, lower electrode 1361 may include a plurality of heating zones, each zone independently controllable to a temperature set point. For example, lower electrode 1361 may include a first thermal zone proximate a center of substrate 1305 and a second thermal zone proximate to a periphery of substrate 1305. Bias power RF generator 1325 is coupled to the lower electrode 1361 through a match 1327. Bias power RF generator 1325 provides bias power, if desired, to energize the plasma. Bias power RF generator 1325 may have a low frequency between about 2 MHz to 60 MHz for example, and in a particular embodiment, is in the 13.56 MHz band.

In an embodiment, the one or more sensor modules may be located at various locations throughout the processing apparatus 1300. For example, a sensor module (or a portion of the sensor module) may be located in one or more locations, such as, but not limited to, at location 1399A along a sidewall of the chamber 1342, at a location 1399D near or in the evacuation region 1304, at a location 1399C adjacent to or within the process ring 1397, and/or integrated with the lid assembly 1310 such as at a location 1399B. Accordingly, detection of various chamber conditions in multiple locations through the processing apparatus 1300 may be determined. The chamber conditions supplied by the one or more sensor modules may be used to modify one or more parameters, such as, for example, processing recipe parameters, cleaning schedules for the processing apparatus 1300, component replacement determinations, and the like.

Figure 14:
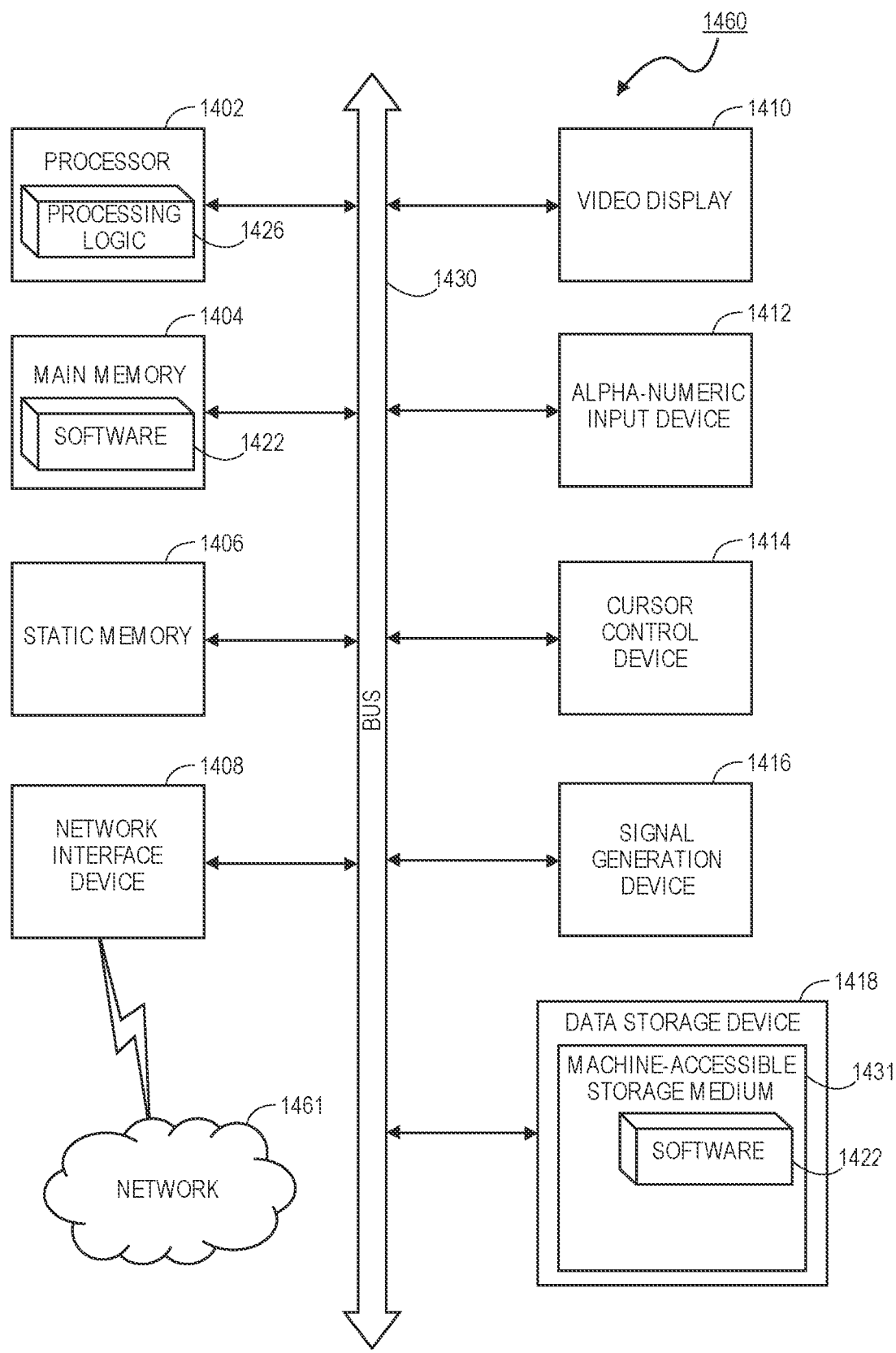
FIG. 14 illustrates a block diagram of an exemplary computer system of a processing tool, in accordance with an embodiment of the present disclosure.

Referring now to FIG. 14, a block diagram of an exemplary computer system 1460 of a processing tool is illustrated in accordance with an embodiment. In an embodiment, computer system 1460 is coupled to and controls processing in the processing tool. The computer system 1460 may be communicatively coupled to one or more vapor concentration sensor modules, such as those disclosed herein. The computer system 1460 may utilize outputs from the one or more vapor concentration sensor modules in order to modify one or more parameters, such as, for example, processing recipe parameters, cleaning schedules for the processing tool, component replacement determinations, and the like.

Computer system 1460 may be connected (e.g., networked) to other machines in a Local Area Network (LAN), an intranet, an extranet, or the Internet. Computer system 1460 may operate in the capacity of a server or a client machine in a client-server network environment, or as a peer machine in a peer-to-peer (or distributed) network environment. Computer system 1460 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 1460, the term "machine" shall also be taken to include any collection of machines (e.g., computers) that individually or jointly execute a set (or multiple sets) of instructions to perform any one or more of the methodologies described herein.

Computer system 1460 may include a computer program product, or software 1422, having a non-transitory machine-readable medium having stored thereon instructions, which may be used to program computer system 1460 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 1460 includes a system processor 1402, a main memory 1404 (e.g., read-only memory (ROM), flash memory, dynamic random access memory (DRAM) such as synchronous DRAM (SDRAM) or Rambus DRAM (RDRAM), etc.), a static memory 1406 (e.g., flash memory, static random access memory (SRAM), etc.), and a secondary memory 1418 (e.g., a data storage device), which communicate with each other via a bus 1430.

System processor 1402 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 1402 may also be one or more special-purpose processing devices such as an application specific integrated circuit (ASIC), a field programmable gate array (FPGA), a digital signal system processor (DSP), network system processor, or the like. System processor 1402 is configured to execute the processing logic 1426 for performing the operations described herein.

The computer system 1460 may further include a system network interface device 1408 for communicating with other devices or machines. The computer system 1460 may also include a video display unit 1410 (e.g., a liquid crystal display (LCD), a light emitting diode display (LED), or a cathode ray tube (CRT)), an alphanumeric input device 1412 (e.g., a keyboard), a cursor control device 1414 (e.g., a mouse), and a signal generation device 1416 (e.g., a speaker).

The secondary memory 1418 may include a machine-accessible storage medium 1431 (or more specifically a computer-readable storage medium) on which is stored one or more sets of instructions (e.g., software 1422) embodying any one or more of the methodologies or functions described herein. The software 1422 may also reside, completely or at least partially, within the main memory 1404 and/or within the system processor 1402 during execution thereof by the computer system 1460, the main memory 1404 and the system processor 1402 also constituting machine-readable storage media. The software 1422 may further be transmitted or received over a network 1461 via the system network interface device 1408. In an embodiment, the network interface device 1408 may operate using RF coupling, optical coupling, acoustic coupling, or inductive coupling.

While the machine-accessible storage medium 1431 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

Thus, embodiments of the present disclosure include vapor concentration sensors for deposition process monitoring and/or deposition chamber condition monitoring.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

What is claimed is:

1. A treatment system, comprising:
a chamber;
a deposition precursor source coupled to an inlet of a deposition chamber;
a non-dispersive infrared (NDIR) vapor concentration sensor between the deposition precursor source and the deposition chamber, wherein the NDIR vapor concentration sensor comprises:
a bottom heater;
a side heater coupled to the bottom heater;
a hot can coupled to the side heater;
a carrier gas inlet coupled to the hot can;
a detector coupled to the hot can, wherein the detector comprises a printed circuit board (PCB);
an NDIR cell body coupled to the detector;
a light source coupled to the NDIR cell body; and
an outlet coupled to the light source.

2. The treatment system of claim 1, wherein the NDIR vapor concentration sensor is configured to collect optical absorption measurements.

3. The treatment system of claim 2, wherein the optical absorption measurements indicate a flow concentration of a deposition precursor from the deposition precursor source.

4. The treatment system of claim 1, wherein the deposition precursor source comprises an ampoule for storing a deposition precursor.

5. A non-dispersive infrared (NDIR) vapor concentration sensor, comprising:
a bottom heater;
a side heater coupled to the bottom heater;
a hot can coupled to the side heater;

a carrier gas inlet coupled to the hot can;
a detector coupled to the hot can, wherein the detector comprises a printed circuit board (PCB);
an NDIR cell body coupled to the detector;
a light source coupled to the NDIR cell body; and
an outlet coupled to the light source.

6. A deposition chamber, comprising:
a chamber wall surrounding a processing region;
a chamber lid over the chamber wall, the chamber lid above the processing region;
a chamber floor beneath the chamber wall, the chamber floor below the processing region; and
a support pedestal in the processing region, the support pedestal below the chamber lid and above the chamber floor, and the support pedestal surrounded by the chamber wall, wherein one of the chamber wall, the chamber lid, the chamber floor, or the support pedestal includes a non-dispersive infrared (NDIR) vapor concentration sensor therein or thereon, wherein the NDIR vapor concentration sensor comprises:
a bottom heater;
a side heater coupled to the bottom heater;
a hot can coupled to the side heater;
a carrier gas inlet coupled to the hot can;
a detector coupled to the hot can;
an NDIR cell body coupled to the detector;
a light source coupled to the NDIR cell body; and
an outlet coupled to the light source.

7. The deposition chamber of claim 6, wherein the chamber wall includes the NDIR vapor concentration sensor therein or thereon.

8. The deposition chamber of claim 6, wherein the chamber lid includes the NDIR vapor concentration sensor therein or thereon.

9. The deposition chamber of claim 6, wherein the chamber floor includes the NDIR vapor concentration sensor therein or thereon.

10. The deposition chamber of claim 6, wherein the support pedestal includes the NDIR vapor concentration sensor therein or thereon.

11. The deposition chamber of claim 6, wherein a second, different, one of the chamber wall, the chamber lid, the chamber floor, or the support pedestal includes a second non-dispersive infrared (NDIR) vapor concentration sensor therein or thereon.

12. The deposition chamber of claim 11, wherein a third, different, one of the chamber wall, the chamber lid, the chamber floor, or the support pedestal includes a third non-dispersive infrared (NDIR) vapor concentration sensor therein or thereon.

13. The deposition chamber of claim 12, wherein a fourth, different, one of the chamber wall, the chamber lid, the chamber floor, or the support pedestal includes a fourth non-dispersive infrared (NDIR) vapor concentration sensor therein or thereon.

14. The deposition chamber of claim 6, wherein the one of the chamber wall, the chamber lid, the chamber floor, or the support pedestal includes a second non-dispersive infrared (NDIR) vapor concentration sensor therein or thereon.

15. The deposition chamber of claim 6, wherein the NDIR vapor concentration sensor is configured to collect optical absorption measurements.

16. The deposition system of claim 6, wherein the detector comprises a printed circuit board (PCB).

* * * * *